(12) United States Patent
Kawabe et al.

(10) Patent No.: US 10,896,835 B2
(45) Date of Patent: Jan. 19, 2021

(54) PROCESSING SYSTEM

(71) Applicant: TOKYO ELECTRON LIMITED, Tokyo (JP)

(72) Inventors: Atsushi Kawabe, Nirasaki (JP); Keisuke Kondoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 286 days.

(21) Appl. No.: 15/938,453

(22) Filed: Mar. 28, 2018

(65) Prior Publication Data

US 2018/0286729 A1    Oct. 4, 2018

(30) Foreign Application Priority Data

Mar. 31, 2017    (JP) .................................. 2017-070987

(51) Int. Cl.
*H01L 21/677*    (2006.01)
*B65G 47/90*    (2006.01)
*H01L 21/67*    (2006.01)

(52) U.S. Cl.
CPC ...... *H01L 21/67742* (2013.01); *B65G 47/907* (2013.01); *H01L 21/67017* (2013.01); *H01L 21/6719* (2013.01); *H01L 21/67173* (2013.01); *H01L 21/67196* (2013.01); *H01L 21/67201* (2013.01); *H01L 21/67745* (2013.01); *H01L 21/67748* (2013.01); *H01L 21/67754* (2013.01); *B65G 2201/0297* (2013.01); *H01L 21/67069* (2013.01); *H01L 21/67207* (2013.01)

(58) Field of Classification Search
CPC ................................................ H01L 21/67173
See application file for complete search history.

(56) References Cited

U.S. PATENT DOCUMENTS

2006/0182536 A1* 8/2006 Rice ................. H01L 21/67178
                                                                414/217
2007/0231109 A1* 10/2007 Pak ......................... C23C 16/54
                                                                414/217

FOREIGN PATENT DOCUMENTS

| JP | 2002-324829 A | 11/2002 |
| JP | 2004-349503 A | 12/2004 |
| JP | 2013140897 A | 7/2013 |
| JP | 2014-179431 A | 9/2014 |
| KR | 100960765 B1 | 6/2010 |

* cited by examiner

*Primary Examiner* — Joseph A Miller, Jr.
(74) *Attorney, Agent, or Firm* — Nath, Goldberg & Meyer; Jerald L. Meyer

(57) ABSTRACT

A system includes a transfer device for transferring workpieces in an atmospheric atmosphere, a transfer unit for transferring the workpieces in a vacuum atmosphere, and a vacuum processing unit including vacuum process chambers connected to the transfer unit and for performing a process on the workpieces in each process chamber. The vacuum processing unit simultaneously performs the process on the workpieces in each process chamber. The process chambers are arranged along a first direction. The transfer unit includes first and second common transfer devices installed along the first direction to transfer the workpieces along the first direction. The first common transfer device is connected to each process chamber at a first side in a second direction perpendicular to the first direction, the second common transfer device is connected to each process chamber at a second side in the second direction.

6 Claims, 10 Drawing Sheets

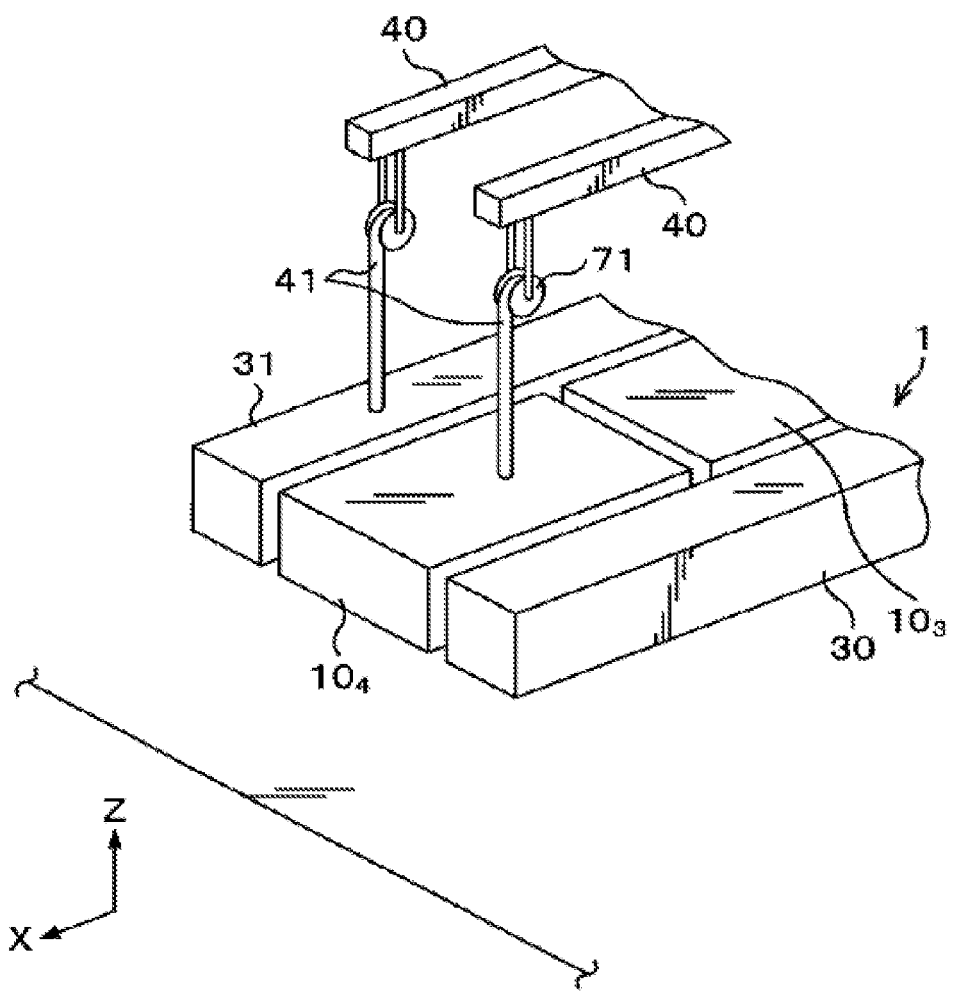

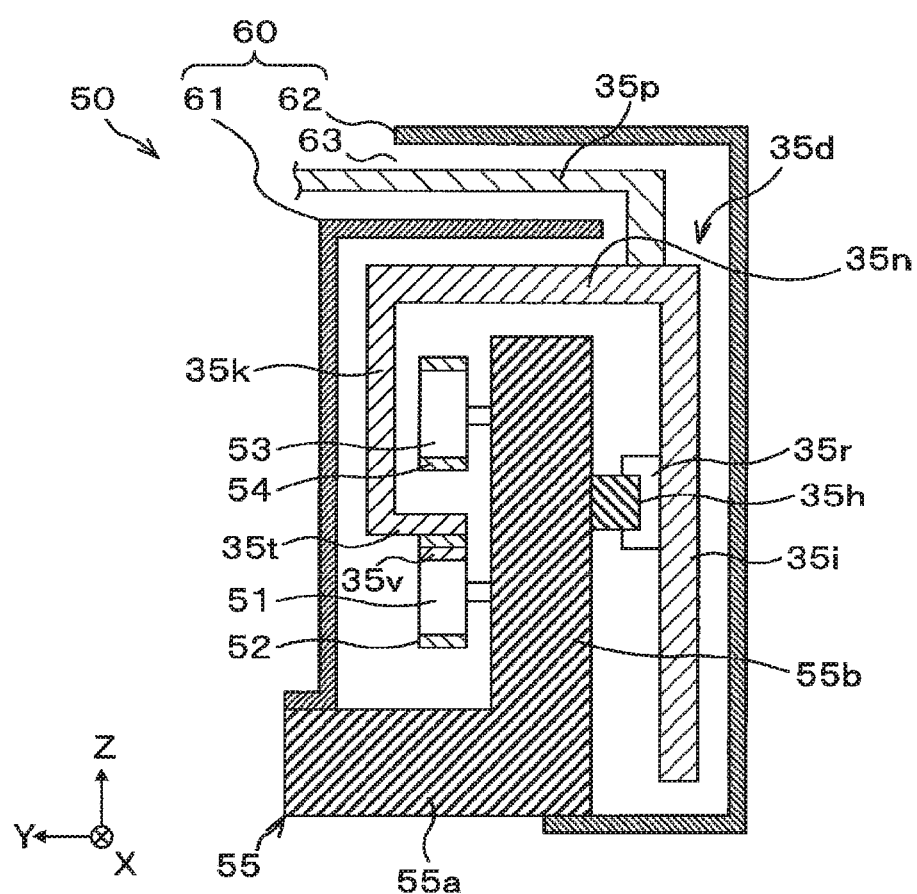

PROCESSING SYSTEM

CROSS-REFERENCE TO RELATED APPLICATION

This application is based upon and claims the benefit of priority from Japanese Patent Application No. 2017-070987, filed on Mar. 31, 2017, the entire contents of which are incorporated herein by reference.

TECHNICAL FIELD

The present disclosure relates to a processing system which performs a predetermined process on a workpiece such as a semiconductor substrate inside a vacuum process chamber.

BACKGROUND

In a process of manufacturing a semiconductor device, a liquid crystal panel or the like, various processes such as a film forming process, an etching process, an oxidation process and the like are performed on a workpiece such as a semiconductor substrate or a liquid crystal substrate (hereinafter, the semiconductor substrate or the liquid crystal substrate will be simply referred to as a "wafer") inside individual vacuum process chambers. If necessary, the aforementioned processes are performed for a single wafer multiple times. In this regard, a processing system of continuously performing various processes without exposing the wafer to the atmosphere has been used. The processing system is connected between vacuum process chambers in which the same or different processes are performed via a common vacuum transfer device, for the purpose of improving throughput or the like.

One such a processing system known as a so-called cluster type processing system has been used in which a plurality of vacuum process chambers is connected to a vacuum transfer device formed in a polygonal shape.

Furthermore, there is a processing system in which a plurality of vacuum process chambers is connected to one sidewall of a vacuum transfer device formed in a horizontally-elongated rectangular parallelepiped shape.

In addition, there is a processing system in which a plurality of vacuum transfer devices, each of which is connected to a plurality of vacuum process chambers, are connected to each other via, a vacuum transfer intermediate chamber.

In recent years, a multi-reactor type vacuum process chamber has been developed in which a plurality of wafers are loaded on a substrate mounting table installed in a single vacuum process chamber and a process is performed on the plurality of wafers in batches. By using the multi-reactor type vacuum process chamber, it is possible to simultaneously process a plurality of substrates, thereby improving the throughput.

Furthermore, there is a demand for the development of a processing system including the plurality of multi-reactor type vacuum process chambers configured as above. However, even if the multi-reactor type vacuum process chamber is incorporated in the conventional processing systems as mentioned above, since the number of wafers that can be transferred by the vacuum transfer device at one time is limited, it takes a period of time to load and unload the wafers into and from the multi-reactor type vacuum process chamber. This makes it difficult to obtain a throughput proportional to the number of wafers that can be collectively processed in the multi-reactor type vacuum process chamber.

Moreover, even if the vacuum transfer device can transfer a number of wafers that can be collectively processed in a multi-reactor type vacuum process chamber at one time, since a wafer transfer position between the vacuum transfer devices in the conventional multi-reactor type vacuum process chamber is fixed, in order to load and unload all the wafers into and from the vacuum process chamber, it is necessary to install a mechanism for moving the wafers, for example, a mechanism for rotating the substrate mounting table, in the vacuum process chamber. The installation of such a mechanism makes it difficult to miniaturize the multi-reactor type vacuum process chamber. This increases the entire processing system in size.

SUMMARY

The present disclosure provides some embodiments of a compact processing system which includes a plurality of multi-reactor type vacuum process chambers that performs a predetermined process on a plurality of workpieces such as wafers in batches, and a vacuum transfer device that is common to the vacuum process chambers, and which is capable of performing the predetermined process on the workpieces with high throughput.

According to one embodiment of the present disclosure, there is provided a processing system, including: an atmospheric-pressure transfer device configured to transfer a plurality of workpieces in an atmospheric pressure atmosphere; a transfer unit connected to the atmospheric-pressure transfer device via a vacuumable load lock chamber and configured to transfer the plurality of workpieces in a vacuum atmosphere; and a vacuum processing unit including a plurality of vacuum process chambers connected to the transfer unit and configured to perform a predetermined process on the plurality of workpieces in each of the plurality of vacuum process chambers, wherein the vacuum processing unit is configured to simultaneously perform the predetermined process on the plurality of workpieces in each of the plurality of vacuum process chambers, and is configured such that the plurality of vacuum process chambers are arranged along a predetermined direction, wherein the transfer unit includes a first common transfer device and a second common transfer device, each being installed along the predetermined direction and configured to transfer the plurality of workpieces along the predetermined direction, wherein the first common transfer device is connected to each of the plurality of vacuum process chambers at a first side in a direction perpendicular to the predetermined direction, and wherein the second common transfer device is connected to each of the plurality of vacuum process chambers at a second side in the direction perpendicular to the predetermined direction.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a partial perspective view of the processing system of FIG. 1.

FIG. 7 is a cross sectional view of a movement mechanism for moving a first slider and a second slider.

DETAILED DESCRIPTION

Figure 1:
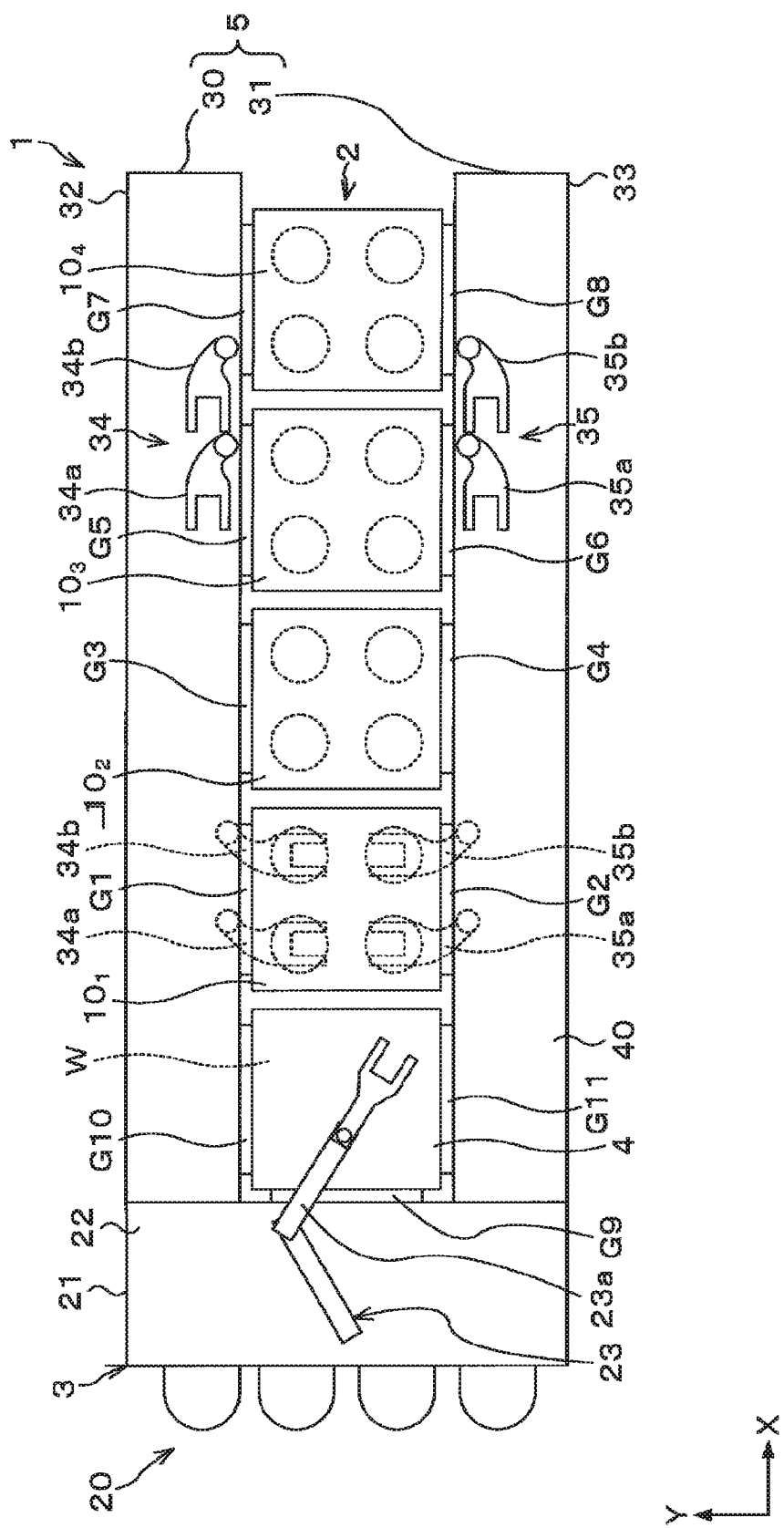
FIG. 1 is a schematic plan view illustrating an example of a processing system according to an embodiment of the present disclosure.

Hereinafter, embodiments of the present disclosure will be described with reference to the drawings. Further, in the present specification and the drawings, elements having substantially like functional components are given like reference numerals and a repeated description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a schematic plan view illustrating an example of a processing system according to an embodiment of the present disclosure. In a processing system 1 of FIG. 1, a wafer W is a workpiece.

As illustrated in FIG. 1, the processing system 1 is provided with a processing unit 2 including four vacuum process chambers $10_1$ to $10_4$, a loader unit 3, a load lock chamber 4, and a transfer unit 5 including first and second common transfer devices 30 and 31.

The processing unit 2 includes a plurality of (four, in this embodiment) vacuum process chambers $10_1$ to $10_4$ arranged along a predetermined direction (an X direction in FIG. 1). The vacuum process chambers $10_1$ to $10_4$ are multi-reactor type chambers that simultaneously perform a predetermined process on a plurality of (four, in FIG. 1) wafers W inside each of the process chambers $10_1$ to $104$. The same kind of process or different kinds of processes may be performed in each of the vacuum process chambers $10_1$ to $10_4$.

Figure 2:
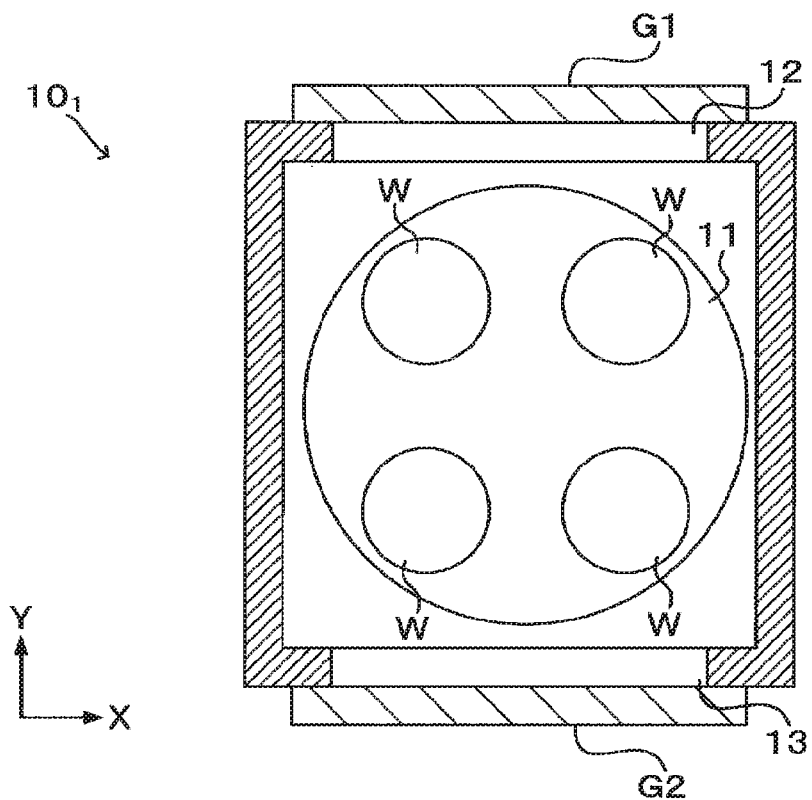
FIG. 2 is a cross sectional view illustrating a schematic configuration of a vacuum process chamber.
Figure 3:
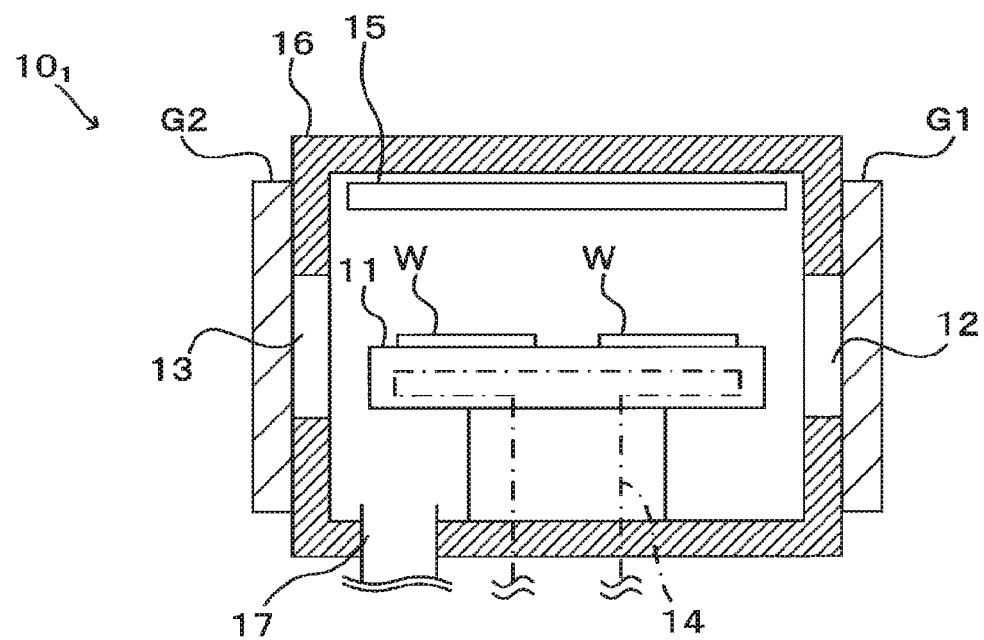
FIG. 3 is a vertical cross sectional view illustrating the schematic configuration of the vacuum process chamber.

FIG. 2 is a cross sectional view illustrating a schematic configuration of the vacuum process chamber $10_1$. FIG. 3 is a vertical cross sectional view illustrating the schematic configuration of the vacuum process chamber $10_1$.

As illustrated in FIG. 2, a substrate mounting table 11, on which four wafers W are mounted while being substantially horizontally arranged, is installed inside the vacuum process chamber $10_1$. Elevating pins (not shown) are installed in the substrate mounting table 11. The wafers W are mounted on the substrate mounting table 11 by the elevating pins.

Furthermore, the vacuum process chamber $10_1$ includes loading/unloading ports 12 and 13 through which the wafers W are transferred. In the vacuum process chamber $10_1$, the loading/unloading ports 12 and 13 are respectively formed in lateral faces facing the first common transfer device 30 and the second common transfer device 31, which will be described later. In other words, in the vacuum process chamber $10_1$, the loading/unloading ports 12 and 13 are formed at both ends in a direction (a Y direction in FIG. 2) perpendicular to the direction in which the vacuum process chambers $10_1$ to $10_4$ are connected in series. Gate valves G1 and G2 are installed in the vicinity of the loading/unloading ports 12 and 13, respectively.

In addition, as illustrated in FIG. 3, a temperature-controlling flow path 14 that communicates with a temperature-control-medium supply part (not shown) is formed inside the substrate mounting table 11 of the vacuum process chamber $10_1$. Furthermore, a gas supply mechanism 15 configured to supply, to the wafers W, a processing gas for performing a predetermined process on the wafers W, is installed in a ceiling portion of the vacuum process chamber $10_1$. The gas supply mechanism 15 has, for example, a shower shape. The gas supply mechanism 15 can perform the process on the wafers W by injecting the processing gas from the ceiling portion of the vacuum process chamber $10_1$. The processing gas is, for example, an HF gas or an $NH_3$ gas for processing an oxide film such as an $SiO2$ film or the like formed on the surfaces of the wafers W. The process performed in the vacuum process chamber $10_1$ is, for example, a chemical process (chemical reaction-based process) as a modification process of the $SiO_2$ film.

Furthermore, a temperature control unit (not shown) is connected to a housing 16 of the vacuum process chamber $10_1$. The temperature of the housing 16 of the vacuum process chamber $10_1$ is freely controlled by the temperature control unit. The temperature of the wafers W muffled on the substrate mounting table 11 is set to a predetermined temperature by heat radiated from the substrate mounting table 11 and heat radiated from the housing 16 of the vacuum process chamber $10_1$. That is to say, the wafers W can be heated or cooled down to a predetermined temperature which is a processing temperature under the control of the temperature control unit that controls the temperature of the temperature control medium flowing through the temperature controlling flow path 14 and the temperature of the housing 16 of the vacuum process chamber 101.

In addition, an exhaust port 17 is formed in a bottom portion of the vacuum process chamber $10_1$ to exhaust the interior of the vacuum process chamber $10_1$. The interior of the vacuum process chamber $10_1$ can be depressurized (vacuumized) by a vacuum pump communicating with the exhaust port 17.

Furthermore, the vacuum process chamber $10_1$ and other vacuum process chambers $10_2$ to $10_4$ have different internal configurations according to processes performed in the respective vacuum process chambers $10_2$ to $10_4$, but the following points are common. That is to say, the common points are that loading/unloading ports are formed at both ends of the respective vacuum process chambers in the direction perpendicular to the direction in which the vacuum process chambers are connected in series, gate valves G3 to G8 are installed for the respective loading/unloading ports, and exhaust ports are formed in bottom surfaces of the respective vacuum process chambers to vacuumize the respective vacuum process chambers.

In this embodiment, the process has been described to be performed with respect to the four wafers W under the same processing conditions, but the processing conditions for the respective wafers W may be different from each other.

The following is a description of FIG. 1. The loader unit 3 serves to perform loading of the wafers W into the processing system 1 and unloading of the wafers W from the processing system 1. The loader unit 3 includes a cassette mounting part 20 and an atmospheric-pressure transfer device 21 that transfers the wafers W in an atmospheric pressure atmosphere.

A plurality of (for example, four) cassettes that can accommodate a plurality of wafers W may be mounted on the cassette mounting part 20 while being arranged in one direction (the Y direction in FIG. 1).

The atmospheric-pressure transfer device 21 includes an atmospheric-pressure transfer chamber 22. The atmospheric-pressure transfer chamber 22 is formed in a rectangular shape whose horizontal cross section is long in a direction (the Y direction in FIG. 1) perpendicular to the connection direction of the vacuum process chambers $10_1$ to $10_4$ (hereinafter, referred to as a process chamber connection direction). The cassette mounting part 20 is connected to one side surface of the atmospheric-pressure transfer chamber 22 (a negative X direction of FIG. 1) in the process chamber connection direction. The load lock chamber 4 is connected to the other side surface (a positive X direction of FIG. 1) in the process chamber connection direction via the gate valve G9. A transfer mechanism 23 for holding and transferring the wafers W is installed in the atmospheric-pressure transfer chamber 22. The transfer mechanism 23 includes a swingable-extendible articulated transfer arm 23a. The transfer mechanism 23 transfers the wafers W between the cassette of the cassette mounting part 20 and the load lock chamber 4 using the transfer arm 23a. Although not illustrated, an alignment device for positioning the wafers W by recognizing a notch or the like formed in the wafer W may be installed in the atmospheric-pressure transfer chamber 22.

The load lock chamber 4 is configured such that the internal space thereof is switched between an atmospheric pressure state and a vacuum state. In addition, the load lock chamber 4 is located between the first and second common transfer devices 30 and 31 as described hereinbelow and is also disposed near the common transfer devices 30 and 31, and the atmospheric-pressure transfer device 21.

Furthermore, in the process chamber connection direction (a backward side in the X direction of FIG. 1), one side surface of the load lock chamber 4 is connected to the loader unit 3 via the gate valve G9.

Also, in the direction perpendicular to the process chamber connection direction (a positive Y direction of FIG. 1), one side surface of the load lock chamber 4 is connected to the first common transfer device 30 via the gate valve G10. In the direction perpendicular to the process chamber connection direction (a negative Y direction of FIG. 1), the other side surface of the load lock chamber 4 is connected to the second common transfer device 31 via the gate valve G11. As described above, in the load lock chamber 4, the gate valve for the first common transfer device 30 and the gate valve for the second common transfer device 31 may be installed separately. That is to say, a wafer loading/unloading port for the first common transfer device 30 and a wafer loading/unloading port for the second common transfer device 31 may be installed separately. The reason for this is to simultaneously perform the loading and unloading of the wafers into and from the load lock chamber 4 by the first common transfer device 30 and the loading and unloading of the wafers into and from the load lock chamber 4 by the second common transfer device 31.

Furthermore, the load lock chamber 4 is disposed so that the loader unit 3, the load lock chamber 4 and the processing unit 2 are sequentially arranged along the process chamber connection direction (the X direction in FIG. 1), and is also disposed at a position near the vacuum process chamber $10_1$ of the processing unit 2. A substrate mounting table (not shown) is installed in the load lock chamber 4. A number of (four, in this embodiment) wafers that can be collectively processed at least in each of the vacuum process chambers $10_1$ to $10_4$, and can be mounted on the substrate mounting table.

The transfer unit 5 is connected to the atmospheric-pressure transfer device 21 of the loader unit 3 via the load lock chamber 4 which can be vacuumized, and transfers the wafers W in a vacuum atmosphere. The transfer unit 5 includes the first and second common transfer devices 31 and 32, each of which is installed along a predetermined direction, namely along the process chamber connection direction (the X direction in FIG. 1), and transfers the wafers W along the process chamber connection direction.

In the direction (the negative Y direction of FIG. 1) perpendicular to the process chamber connection direction, one side of the first common transfer device 30 is connected to each of the four vacuum process chambers $10_1$ to $10_4$ and the load lock chamber 4. On the other hand, in the direction (the positive Y direction of FIG. 1) perpendicular to the process chamber connection direction, one side of the second common transfer device 31 is connected to each of the four vacuum process chambers $10_1$ to $10_4$ and the load lock chamber 4. In other words, the first and second common transfer devices 30 and 31 are connected to the vacuum process chambers $10_1$ to $10_4$ and the load lock chamber 4 in such a way that the four vacuum process chambers $10_1$ to $10_4$ and the load lock chamber 4 are placed between the first and second common transfer devices 30 and 31 in the direction perpendicular to the process chamber connection direction.

These first and second common transfer devices 30 and 31 respectively include vacuum transfer chambers 32 and 33 whose horizontal cross sections are formed in a rectangular shape that is long in the process chamber connection direction (the X direction in FIG. 1).

In the direction (the positive Y direction of FIG. 1) perpendicular to the process chamber connection direction, one side surface of the vacuum transfer chamber 32 is connected to the load lock chamber 4, the vacuum process chamber $10_1$, the vacuum process chamber $10_2$, the vacuum process chamber $10_3$, and the vacuum process chamber $10_4$ arranged sequentially from the side of the loader unit 3 in the process chamber connection direction (the negative X direction) via the gate valves G10, G1, G3, G5, and G7.

In the direction (the negative Y direction of FIG. 1) perpendicular to the process chamber connection direction, one side surface of the vacuum transfer chamber 33 is connected to the load lock chamber 4, the vacuum process chamber $10_1$, the vacuum process chamber $10_2$, the vacuum process chamber $10_3$, and the vacuum process chamber $10_4$ arranged sequentially from the side of the loader unit 3 in the process chamber connection direction (the negative X direction) via the gate valves G11, G2, G4, G6, and G8.

In addition, the vacuum transfer chamber 32 includes a transfer mechanism 34 for holding the wafers W and transferring them along the process chamber connection direction. The transfer mechanism 34 includes at least a pair of transfer arms 34a and 34b which are movable and rotatable at least in the process chamber connection direction. The transfer mechanism 34 transfers the wafers W between the load lock chamber 4, the vacuum transfer chamber 32, and the vacuum process chambers $10_1$ to $10_4$ using the transfer arms 34a and 34b.

Similarly, the vacuum transfer chamber 33 includes a transfer mechanism 35 for holding the wafers W and transferring them along the process chamber connection direction. The transfer mechanism 35 includes a pair of transfer arms 35a and 35b which are movable and rotatable at least in the process chamber connection direction. The transfer mechanism 35 transfers the wafers W between the load lock chamber 4, the vacuum transfer chamber 33, and the vacuum process chambers $10_1$ to $10_4$ using the transfer arms 35a and 35b.

The vacuum transfer chambers 32 and 33 can be vacuumized by a vacuum pump (not shown).

Next, a process performed using the processing system 1 configured as above will be described.

First, unprocessed wafers W are held by the transfer arm 23a and transferred from the interior of the cassette mounted on the cassette mounting part 20 to an alignment device (not shown) where positions of the wafers W are aligned.

After the position alignment, the unprocessed wafers W are held by the transfer arm 23a and moved to the load lock chamber 4.

Simultaneously, the gate valve G9 is opened to open the interior of the load lock chamber. Then, the wafers W are mounted on the substrate mounting table inside the load lock chamber 4 by driving the transfer arm 23a.

Thereafter, four wafers W are loaded on the substrate mounting table inside the load lock chamber 4 by repeatedly performing the position alignment of the wafers W and the transfer of the wafers W by the transfer arm 23a as described above.

Subsequently, the gate valve G9 is closed to seal the interior of the load lock chamber 4. The interior of the load lock chamber 4 is vacuumized by driving a vacuum exhaust system so that an internal pressure of the load lock chamber is regulated.

After the pressure regulation, the gate valves G10 and G11 are opened so that the load lock chamber 4 is in communication with the vacuum transfer chambers 32 and 33 which are kept in a vacuum atmosphere in advance. Then, a first set of two wafers W mounted at the side of the vacuum transfer chamber 32 inside the load lock chamber 4 are picked up by the transfer arms 34a and 34b of the vacuum transfer chamber 32. Simultaneously, a second set of two wafers W mounted at the side of the vacuum transfer chamber 33 inside the load lock chamber 4 are picked up by the transfer arms 35a and 35b of the vacuum transfer chamber 33.

After the pick-up operation, the first set of two wafers W are moved into the vacuum transfer chamber 32 by the transfer arms 34a and 34b and simultaneously, the second set of two wafers W are moved into the vacuum transfer chamber 33 by the transfer arms 35a and 35b. After the movement, the gate valves G10 and G11 are closed. The first set of two wafers W are moved to the vicinity of the vacuum process chamber $10_1$ inside the vacuum transfer chamber 32 by the transfer arms 34a and 34b, and simultaneously, the second set of two wafers W are moved to the vicinity of the vacuum process chamber $10_1$ inside the vacuum transfer chamber 33 by the transfer arms 35a and 35b.

Subsequently, the gate valves G1 and G2 are opened so that the vacuum transfer chambers 32 and 33 are in communication with the vacuum process chamber $10_1$ kept in a vacuum atmosphere in advance. Thereafter, the first set of two wafers W are mounted on the substrate mounting table 11 positioned at the side of the vacuum transfer chamber 32 inside the vacuum process chamber $10_1$ using the transfer arms 34a and 34b, elevating pins and the like in the vacuum transfer chamber 32. Simultaneously, the second set of two wafers W are mounted on the substrate mounting table 11 positioned at the side of the vacuum transfer chamber 33 inside the vacuum process chamber $10_1$ using the transfer arms 35a and 35b, elevating pins and the like in the vacuum transfer chamber 33.

After the mounting, the gate valves G1 and G2 are closed to seal the interior of the vacuum process chamber $10_1$. Thereafter, a gas is introduced into the vacuum process chamber $10_1$ so that the four wafers are collectively subjected to a process inside the vacuum process chamber $10_1$.

Upon completing the process in the vacuum process chamber $10_1$, the internal atmosphere of the vacuum process chamber $10_1$ is adjusted and then the gate valves G1 and G2 are opened. In this state, the processed four wafers W are simultaneously transferred to a predetermined vacuum process chamber, for example, the vacuum process chamber $10_2$, by driving the transfer arms 34a and 34b and the transfer arms 35a and 35b. In the vacuum process chamber $10_2$, a process different from the process in the vacuum process chamber $10_1$ is performed.

Thereafter, the four wafers W are simultaneously transferred between the vacuum process chambers $10_1$ and $10_2$ using the transfer arms 34a and 34b and the transfer arms 35a and 35b until all the processes are completed.

The wafers W which have been subjected to all the processes are returned to the original cassette in a reverse order of the operation described above.

As described above, in the processing system 1, the four wafers W can be simultaneously loaded into and unloaded from the multi-reactor type vacuum process chambers $10_1$ to $10_4$ by the first common transfer device 30 and the second common transfer device 31 installed along the process chamber connection direction. Thus, it is possible to perform the process on the wafers W with high throughput.

On the other hand, unlike the processing system 1, there may be a case where wafers are loaded and unloaded only through one side of a vacuum process chamber and are mounted on a substrate mounting table of the respective vacuum process chamber. This case requires a rotation mechanism for rotating the substrate mounting table or a transfer mechanism for transferring workpieces inward from a front side (through which the wafers are loaded and unloaded) of the substrate mounting table using a transfer means. However, in the processing system 1, since the first common transfer device 30 and the second common transfer device 31 are connected to the multi-reactor type vacuum process chambers $10_1$ to $10_4$ from different directions, it is possible to mount the four wafers W on the substrate mounting table without rotating the substrate mounting table inside the vacuum process chambers $10_1$ to $10_4$ or moving the wafers W inside the vacuum process chambers $10_1$ to $10_4$. This eliminates the need to install the rotation mechanism inside the vacuum process chambers $10_1$ to $10_4$, thus reducing the size of each of the vacuum process chambers $10_1$ to $10_4$ and downsizing the processing system 1. In addition, since it is not necessary to install the transfer mechanism inside the vacuum process chambers $10_1$ to $10_4$, there is no adverse effect on the process, which may be caused by the transfer mechanism (for example, process uniformity deteriorates between the respective wafers W when the process is performed under the same processing conditions inside the same vacuum process chamber).

Figure 5A:
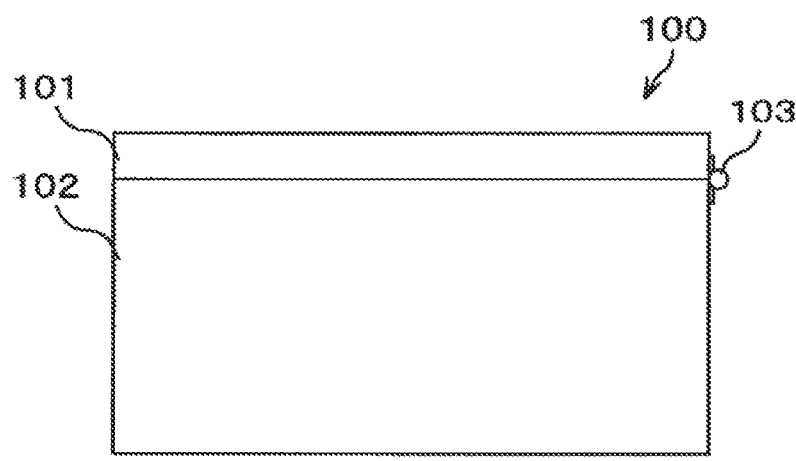
FIGS. 5A and 5B are views illustrating installation formations of lids in a conventional vacuum process chamber and a vacuum process chamber according to the present embodiment.
Figure 5B:
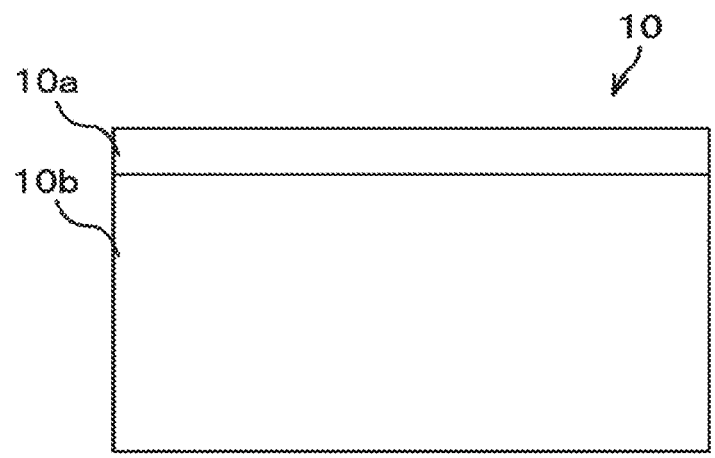

FIG. 4 and FIGS. 5A and 5B are views illustrating other effects of the processing system 1. FIG. 4 being a partial perspective view of the processing system 1 and FIGS. 5A and 5B being front views of the conventional vacuum process chamber and the vacuum process chamber according to this embodiment.

In the processing system 1, as illustrated in FIG. 4, since the vacuum process chambers $10_1$ to $10_4$ are connected in series along a predetermined direction (the X direction in FIG. 4), a rail 40 extending along the predetermined direction may be installed in a ceiling or the like of the factory, and a crane 41 that can be shared by the vacuum process chambers $10_1$ to $10_4$ may be installed in the rail 40 to remove lids of the vacuum process chambers $10_1$ to $10_4$.

In the conventional cluster type processing system as described in the Background section of the present disclosure, if a crane that can be shared by the plurality of vacuum process chambers is installed in a ceiling rail of the factory to remove lids of the vacuum process chambers as in this embodiment, the shape of the rail becomes complicated. Therefore, in the conventional cluster type processing system, it is difficult to install a crane that can be ed by the plurality of vacuum process chambers.

Thus, in the case where the multi-reactor type vacuum process chamber is applied to the conventional cluster type processing system, as illustrated in FIG. 5A, a lid 101 can be opened and closed by connecting one end of the lid 101 to a process chamber main body 102 via a hinge 103. However, since the lid 101 of the multi-reactor type vacuum process chamber is large and heavy, it is difficult for a human to manually open and close the lid 101. Therefore, it is necessary to install a mechanism for assisting with such an opening/closing operation in the vacuum process chamber 100. This makes the vacuum process chamber 100 large.

On the other hand, in the processing system 1 according to this embodiment, it is possible to install the crane 41 that can be shared by the vacuum process chambers $10_1$ to $10_4$, and to open and close the lids of the vacuum process chambers $10_1$ to $10_4$ by the crane 41. Therefore, as illustrated in FIG. 5B, there is no need to install the hinge between a lid 10a and a process chamber main body 10b and further the mechanism for assisting the opening/closing operation. This makes it possible to reduce the size of the vacuum process chambers $10_1$ to $10_4$ and to reduce the footprint of the processing system 1.

Furthermore, since the crane 41 can be installed as described above, the maintenance or replacement can be done simply by using the crane 41 for heavy objects other than the lids 10a of the vacuum process chambers $10_1$ to $10_4$, for example, the substrate mounting table 11.

Figure 6A:
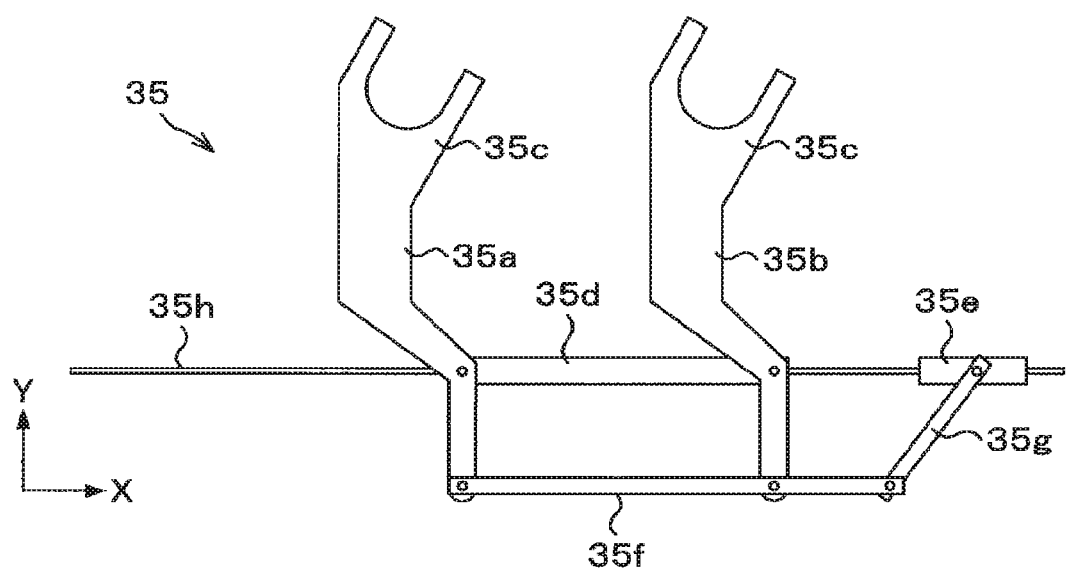
FIGS. 6A and 6B are views illustrating an example of a transfer mechanism of a workpiece.
Figure 6B:
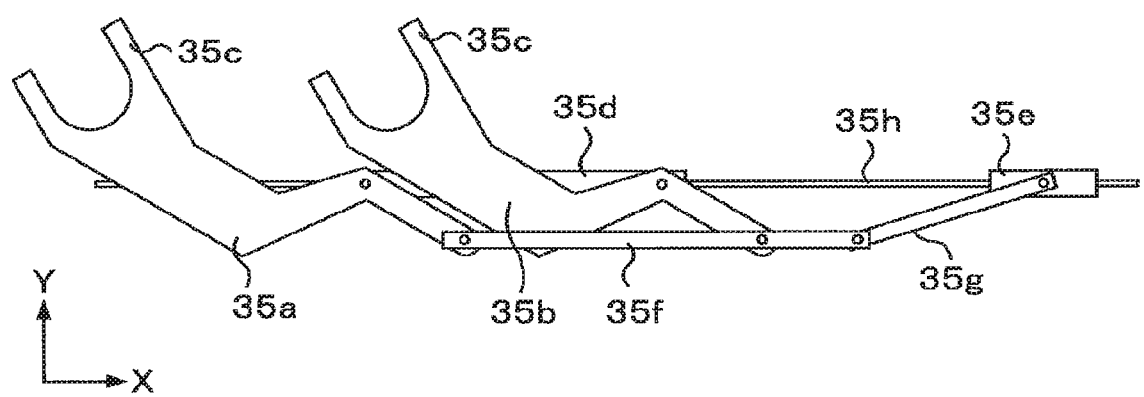

FIGS. 6A and 6B are explanatory views of an example of the transfer mechanism 35. The configuration of the transfer mechanism 34 is similar to that of the transfer mechanism 35, and therefore, a description thereof will be omitted.

As illustrated in FIGS. 6A and 6B, the transfer mechanism 35 includes a pair of transfer arms 35a and 35b as support members. Each of the transfer arms 35a and 35b includes a support portion 35c installed at one end thereof and configured to support the wafer W. The transfer arms 35a and 35b are formed to have substantially the same shape, and are configured to operate in substantially the same manner.

The transfer mechanism 35 further includes a first slider 35d and a second slider 35e.

The first slider 35d moves along a predetermined direction, namely the process chamber connection direction (the X direction in FIGS. 6A and 6B) described above. Furthermore, the first slider 35d pivotally supports the pair of transfer arms 35a and 35b. Specifically, the first slider 35d is formed in a rectangular shape that is long in the process chamber connection direction. One end of the first slider 35d pivotally supports the transfer arm 35a and the other end thereof pivotally supports the transfer arm 35b. The transfer arms 35a and 35b are pivotally supported by the first slider 35d so that the substantially center of each of the transfer arms 35a and 35b serves as the rotation axis.

The second slider 35e moves along the process chamber connection direction (the X direction in FIGS. 6A and 6B). Furthermore, the second slider 35e is connected to the transfer arms 35a and 35b so as to rotate the pair of transfer arms 35a and 35b. Specifically, the second slider 35e is connected to a portion that is not pivotally supported by the first slider 35d of the transfer arms 35a and 35b, namely to the other end portion opposite the support portion 35c in each of the transfer arms 35a and 35b in the example of FIGS. 6A and 6B. More specifically, the second slider 35e is connected to the other end portion of each of the transfer arms 35a and 35b via connection members 35f and 35g. Furthermore, the connection member 35f is turnably connected to the transfer arms 35a and 35b and connects between the other end portions of the transfer arms 35a and 35b. The connection member 35g connects the connection member 35f and the second slider 35e. One end of the connection member 35g is connected to the connection member 35f so as to be rotated about the connection member 35f, and the other end of the connection member 35g is connected to the second slider 35e so as to be rotated about the second slider 35e. Both the connection members 35f and 35g are formed of a member having rigidity.

Furthermore, the transfer mechanism 35 includes a guide 35h extending along a predetermined direction, namely the process chamber connection direction (the X direction in FIGS. 6A and 6B) described above. The first slider 35d and the second slider 35e can move in the process chamber connection direction along the guide 35h.

As illustrated in FIG. 6B, in the transfer mechanism 35 including the aforementioned members, the transfer arms 35a and 35b can be moved along the process chamber connection direction (the X direction in FIG. 6B) by moving the sliders 35d and 35e in the same direction at the same speed in a state in which a distance between the first slider 35d and the second slider 35e is increased.

Furthermore, the transfer arms 35a and 35b can be rotated by moving the first slider 35d and the second slider 35e such that the distance between the first slider 35d and the second slider 35e changes. In particular, as illustrated in FIG. 6A, by moving the sliders 35d and 35e such that the distance between the first slider 35d and the second slider 35e is reduced, it is possible to rotate the transfer arms 35a and 35b in conjunction with each other, for example, until the support portions 35c are inserted into the vacuum process chamber $10_1$.

As described above, when the transfer arms 35a and 35b are operated in conjunction with each other, a pitch between the support portions 35c of the transfer arms 35a and 35b is set to be equal to a mounting pitch between the wafers W in the process chamber connection direction inside each of the vacuum process chambers $10_1$ to $10_4$ and a mounting pitch between the wafers W in the process chamber connection direction inside the load lock chamber 4.

Figure 8:
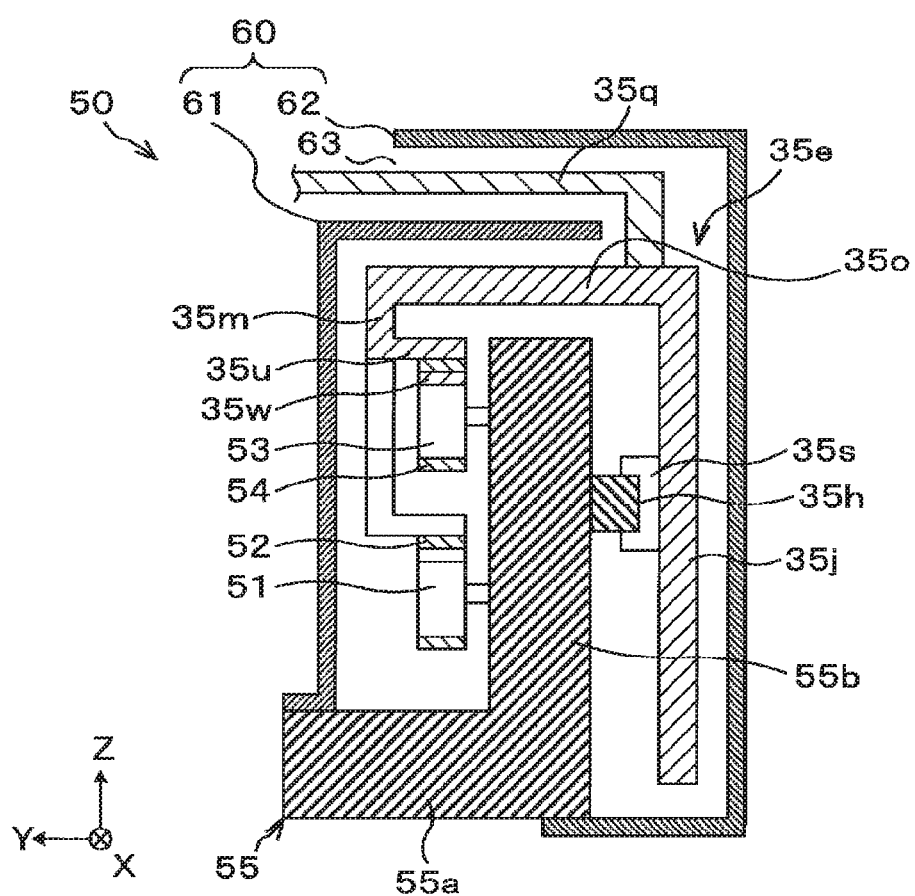
FIG. 8 is a cross sectional view of a movement mechanism for moving the first slider and the second slider.

Next, an example of the movement mechanism for moving the first slider 35d and second slider 35e along the process chamber connection direction will be described with reference to FIGS. 7 to 9. FIGS. 7 and 8 are cross sectional views of a portion including the first slider 35*d* and the second slider 35*e* in the movement mechanism, respectively, which illustrate cross sections when viewed from the extending direction of the guide 35*h*, namely the process chamber connection direction. Furthermore, FIG. 9 is a plan view of a portion where pulleys or the like of the movement mechanism as described hereinbelow are disposed, in which the illustration of a cover member and a connection portion (to be described later) is omitted.

As illustrated in FIGS. 7 and 8, the first slider 35*d* and the second slider 35*e* which are moved by a movement mechanism 50 have long-side portions 35*i* and 35*j* and short-side portions 35*k* and 35*m*. The long-side portions 35*i* and 35*j* and the short-side portions 35*k* and 35*m* face each other, respectively. Further, the first slider 35*d* and the second slider 35*e* have connection portions 35*n* and 35*o* for connecting the long-side portions 35*i* and 35*j* and the short-side portions 35*k* and 35*m*, respectively. Furthermore, the first slider 35*d* and the second slider 35*e* have connection portions 35*p* and 35*q* connected to the transfer arms 35*a* and 35*b* and the connection member 35*g*. In addition, the first slider 35*d* and the second slider 35*e* have engagement portions 35*r* and 35*s* that engages with the guide 35*h*, which are formed in the long-side portions 35*i* and 35*j*, respectively.

Figure 9:
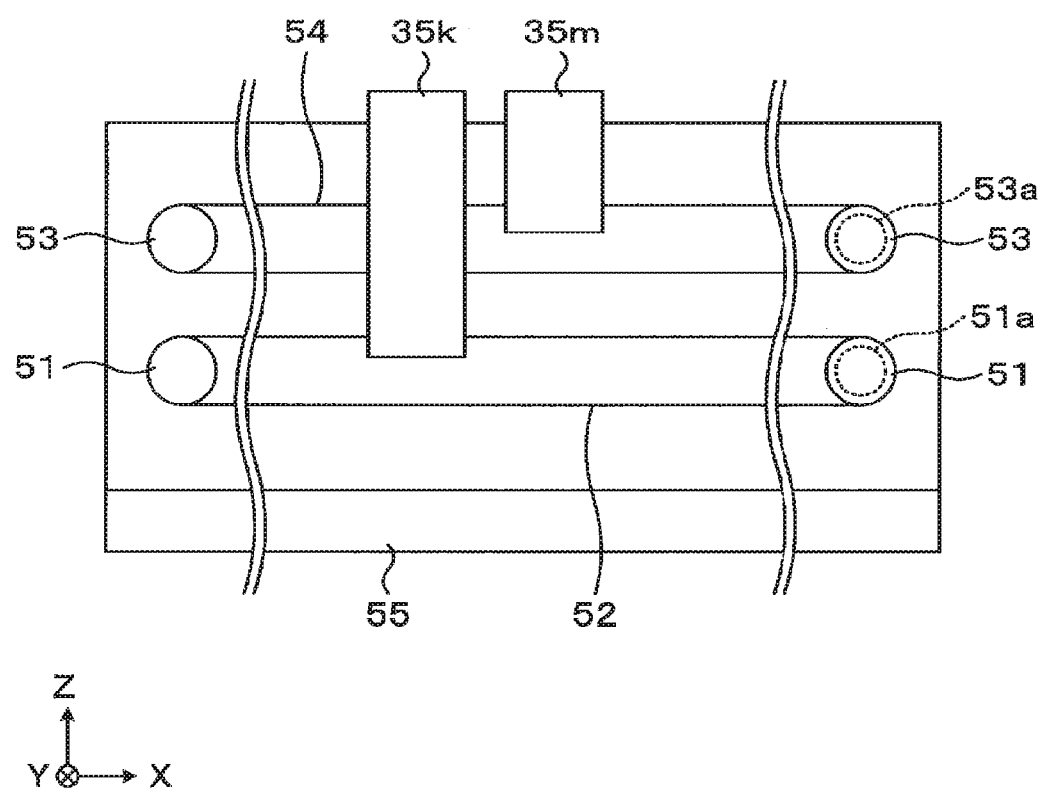
FIG. 9 is a plan view of a portion where pulleys or the like of the movement mechanism are arranged.

As illustrated in FIG. 9, in addition to the aforementioned guide 35*h*, the movement mechanism 50 includes a pair of pulleys 51 and a toothed belt 52 to move the first slider 35*d*.

The pair of pulleys 51 is arranged along the extending direction of the guide 35*h*, namely the process chamber connection direction (the X direction in FIG. 9). At least one of the pair of pulleys 51 is rotatably driven by a motor 51*a* used as a driving source. A tooth mold (not shown) is formed outside the pulleys 51.

The toothed belt 52 extends to engage the pair of pulleys 51. The toothed belt 52 is fixed to the short-side portion 35*k* of the first slider 35*d*. In addition, a tooth mold (not shown) that engages with the tooth mold of each of the pulleys 51 is formed in an inner surface of the toothed belt 52.

Furthermore, the first slider 35*d* is incorporated in the movement mechanism 50 in the following manner. First, the engagement portion 35*r* of the first slider 35*d* is engaged with the guide 35*h*. In this state, the toothed belt 52 is sandwiched between a convex portion 35*t* projecting from the short-side portion 35*k* of the first slider 35*d* toward the long-side portion 35*i* thereof and an auxiliary member 35*v*, and the convex portion 35*t* and the auxiliary member 35*v* are fastened by a fastening member (not shown). In this way, the first slider 35*d* can be fixed to the movement mechanism 50 while moving along the guide 35*h*.

In addition, the movement mechanism 50 includes a pair of pulleys 53 and a toothed belt 54 to move the second slider 35*e*.

The pair of pulleys 53 is arranged along the extending direction of the guide 35*h*, namely the process chamber connection direction (the X direction in the drawing). At least one of the pulleys 53 is rotatably driven by a motor 53*a* used as a driving source. A tooth mold (not shown) is formed outside the pulleys 53.

The toothed belt 54 extends to engage the pair of pulleys 53. The toothed belt 54 is fixed to the short-side portion 35*m* of the second slider 35*e*. In addition, a tooth mold (not shown) that engages with the tooth mold of each of the pulleys 53 is formed in an inner surface of the toothed belt 54.

Furthermore, the second slider 35*e* is incorporated in the movement mechanism 50 in the following manner. First, the engagement portion 35*s* of the second slider 35*d* is engaged with the guide 35*h*. In this state, the toothed belt 54 is sandwiched between a convex portion 35*u* projecting from the short-side portion 35*m* of the second slider 35*e* toward the long-side portion 35*i* thereof and an auxiliary member 35*w*, and the convex portion 35*u* and the auxiliary member 35*w* are fastened by a fastening member (not shown). In this way, the second slider 35*e* can be fixed to the movement mechanism 50 while moving along the guide 35*h*.

In the movement mechanism 50, the first slider 35*d* and the second slider 35*e* can be moved along the guide 35*h*, namely the process chamber transfer direction, by rotatably driving the pulleys 51 and 53 by the motor 51*a* and the motor 53*a*, and rotating the toothed belts 52 and 54 with the driving of the pulleys 51 and 53.

In some embodiments, other pulleys or the like may be installed separately as tensioners for the toothed belts 52 and 54 from the aforementioned pulleys 51 and 53.

Furthermore, the movement mechanism 50 includes a base member 55. The base member 55 includes a fixed portion 55*a* fixed to the second common transfer device 31 and a support portion 55*h* extending from the fixed portion 55*a* in a direction perpendicular to the fixed portion 55*a*. The two pairs of pulleys 51 and 53 are fixed to one surface of the support portion 55*h*, and the guide 35*h* is fixed to a surface opposite the one surface of the support portion 55*b*.

In addition, a cover 60 that covers the movement mechanism 50 is installed in the movement mechanism 50. The cover 60 covers a portion that may act as a dust generation source inside the movement mechanism 50. Specifically, the cover 60 includes cover members 61 and 62. The cover member 61 covers the pulleys 51 and 53 and the toothed belts 52 and 54, and the cover member 62 covers the guide 35*h*.

One end of each of the cover members 61 and 62 is fixed to the base member 55. A gap 63 is formed between the other end of the cover member 61 and the other end of the cover member 62. The connection portions 35*p* and 35*q* are exposed from the gap 63. However, the other end of the cover member 61 and the other end of the cover member 62 overlap so that the dust generation source such as the pulleys 51 and 53 is not visible from the gap 63. This makes it difficult for dust or the like generated by the pulleys 51 and 53 and the like to leak out of the cover 60.

By installing the cover 60 in this way, it is possible not to expose the portion that may act as the dust generation source to the vacuum. Further, it is possible to prevent the dust generated by the movement mechanism 50 from adhering to the wafers W being transferred, thus avoiding an adverse effect.

Furthermore, the dust generated by the pulleys 51 and 53 or the like and stored inside the cover 60 may be discharged via an exhaust port formed in the cover 60 at a timing different from the timing at which the interior of the second common transfer device 31 is evacuated to be in a vacuum atmosphere. During the discharge, a purge gas such as an $N_2$ gas may be introduced into the cover 60 to facilitate the discharge of dust. It is therefore possible to more reliably prevent the dust generated by the movement mechanism 50 from adhering to the wafers W being transferred, thus avoiding an adverse effect.

As described above, the driving source of the movement mechanism 50, namely the driving source of the second common transfer device 31, is the motor 51*a* and the motor 53*a*. Thus, the driving sources are very small. This makes it possible to miniaturize the second common transfer device 31, and especially to reduce the thickness of the second common transfer device 30. This holds true in the first common transfer device 30.

Furthermore, while in the above embodiment, as illustrated in FIGS. 6A and 6B, the first slider 35*d* and the second slider 35*e* have been described as using the same guide 35*h*, they may use individual guides. However, it is possible to reduce the number of dust generation sources by using a single guide 35*h*, namely a common guide.

In addition, in the conventional cluster type processing system mentioned above, the mechanism for rotating the transfer arms inside the common transfer device is necessary, and thus the components constituting the mechanism occupies the space defined below the transfer chamber of the common transfer device at a substantial level. On the other hand, in the processing system 1 according to this embodiment, transfer-related components are not disposed below the vacuum transfer chambers 32 and 33 of the first and second common transfer devices 30 and 31. Therefore, in the processing system 1 according to this embodiment, it is possible to secure spaces below the vacuum transfer chambers 32 and 33, thus improving the maintainability performed below the vacuum process chambers $10_1$ to $10_4$.

Figure 10:
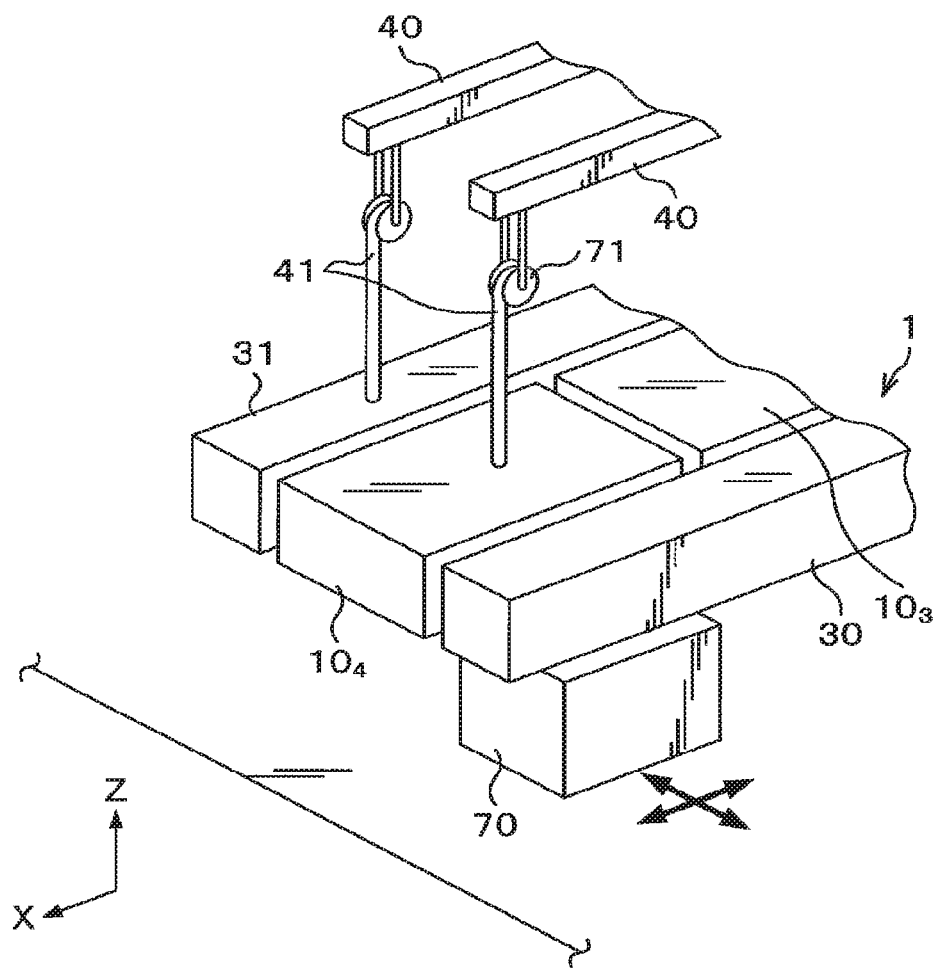
FIG. 10 is a partial perspective view of the processing system of FIG. 1.

Next, other effects achieved by the processing system 1 will be described with reference to FIG. 10.

In the processing system 1, as described above, since there are spaces below the vacuum transfer chambers 32 and 33, namely the first and second common transfer devices 30 and 31, at least a portion of components related to the process chamber, which constitute the exhaust mechanism, the temperature control mechanism of the mounting table and the like which were accommodated below the vacuum process chamber in the related art, can be disposed below the first and second common transfer devices 30 and 31. Accordingly, the operator can easily gain access to such process chamber-related components, which makes it possible to improve the maintainability of the process chamber-related components. Furthermore, in the processing system 1, as illustrated in FIG. 10, storage devices 70 slidable in four orthogonally related directions may be installed below the vacuum process chambers $10_1$ to $10_4$. With this configuration, by accommodating the process chamber-related components in the respective storage devices 70, it is possible to slide the storage device 70 (i.e., the process chamber-related components), take the process chamber-related components out of the storage device 70 and bring the same to a position that is easy-to-access. Thus, the maintainability of the process chamber-related components is good. Furthermore, since the storage devices 70 can slide in the horizontal direction (the X-Y directions in FIG. 10), it is possible to secure a large distance/space between the process chamber-related components stored in one storage device 70 and the process chamber-related components stored in another storage device 70 during maintenance. This makes it possible to further improve the maintainability.

Figure 11:
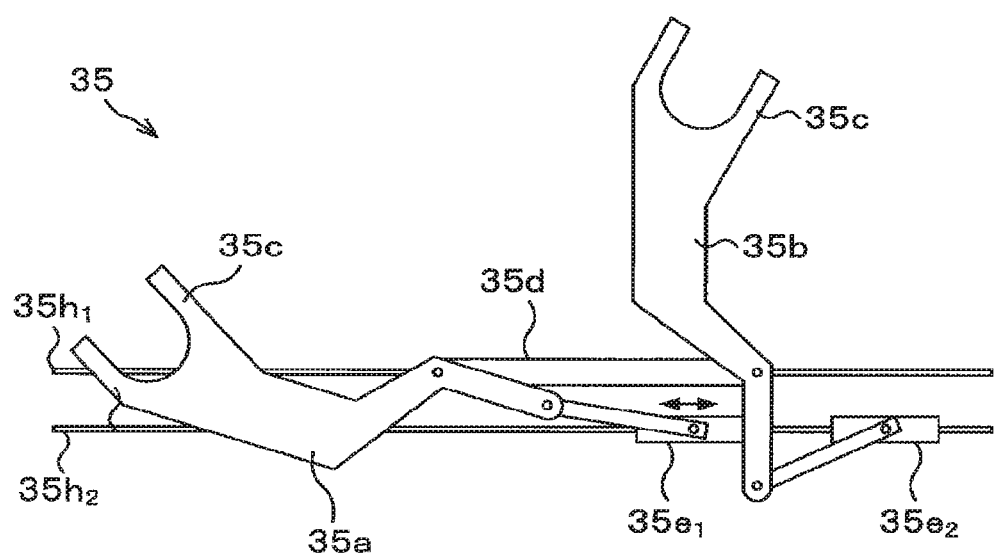
FIG. 11 is a view illustrating another example of a transfer mechanism of the workpiece.

FIG. 11 is a view illustrating another example of the transfer mechanism 35.

In the examples of FIGS. 6A and 6B, the first slider 35*d* that pivotally supports the transfer arms and the second slider 35*e* that rotates the transfer arms are common to the two transfer arms 35*a* and 35*b*. On the other hand, in the embodiment of FIG. 11, the first slider 35*d* is common to the two transfer arms 35*a* and 35*b*, while second sliders $35e_1$ and $35e_2$ are separately installed in the two transfer arms 35*a* and 35*b*. With this configuration, it is possible to rotate the two transfer arms 35*a* and 35*b* independently of each other.

In the case where the second sliders $35e_1$ and $35e_2$ are installed for each transfer arm, a guide $35h_1$ for the first slider 35*d* and a guide $35h_2$ for the second sliders $35e_1$ and $35e_2$ may be installed independently of each other.

Furthermore, although not illustrated, independent first sliders may be used for each transfer arm.

By separately installing the first sliders and the second sliders for each transfer arm, it is possible to move each transfer arm independently of each other and rotate them independently of each other.

While in the above embodiments, the wafers W have been described to be transferred two by two by the first common transfer device 30 and the second common transfer device 31, they may be transferred one by one or three by three. In the case of transferring the wafers one by one, one of the pair of transfer arms may be removed from the first slider 35*d* or the like. Alternately, in the case of transferring the wafers three by three, the same kind of transfer arms may be additionally installed. With the transfer mechanism according to this embodiment illustrated in FIGS. 6A and 6B or the like, it is possible to simply increase or decrease the number of transfer arms.

Furthermore, while in the above embodiments, the load lock chamber has been described to be common to the first common transfer device 30 and the second common transfer device 31 independent load lock chambers may be installed separately for each of the common transfer devices 30 and 31. However, by using the common load lock chamber, it is possible to reduce the cost.

While the embodiment of the present disclosure has been described above, the present disclosure is not limited to this example. It will be apparent to those skilled in the art that various changes or modifications may be made within the scope of the technical idea specified in the claims, and it is to be understood that of course they belong to the technical scope of the present disclosure.

The present disclosure is useful for a technique for transferring a workpiece such as a semiconductor wafer to a vacuum process chamber in a vacuum atmosphere.

According to the present disclosure in some embodiments, it is possible to provide a compact processing system which includes a plurality of multi-reactor type vacuum process chambers that collectively performs a predetermined process on a plurality of workpieces such as wafers, and a vacuum transfer device that is common to the vacuum process chambers, and which is capable of performing the process on the workpiece with high throughput.

What is claimed is:

1. A processing system, comprising:
   an atmospheric-pressure transfer device configured to transfer a plurality of workpieces in an atmospheric pressure atmosphere;
   a transfer unit connected to the atmospheric-pressure transfer device via a vacuumable load lock chamber and configured to transfer the plurality of workpieces in a vacuum atmosphere; and
   a vacuum processing unit including a plurality of vacuum process chambers connected to the transfer unit and configured to perform a predetermined process on the plurality of workpieces in each of the plurality of vacuum process chambers,
   wherein the vacuum processing unit is configured to simultaneously perform the predetermined process on the plurality of workpieces in each of the plurality of vacuum process chambers, and is configured such that the plurality of vacuum process chambers are arranged along a predetermined direction, wherein the transfer unit includes a first common transfer device and a second common transfer device, each being installed along the predetermined direction and configured to transfer the plurality of workpieces along the predetermined direction, wherein the first common transfer device is connected to each of the plurality of vacuum process chambers at a first side in a direction perpendicular to the predetermined direction, wherein the second common transfer device is connected to each of the plurality of vacuum process chambers at a second side in the direction perpendicular to the predetermined direction, wherein each of the plurality of vacuum process chambers includes a workpiece mounting table on which the plurality of workpieces are horizontally arranged, wherein the first common transfer device and the second common transfer device are configured to simultaneously load and unload the plurality of workpieces arranged horizontally on the workpiece mounting table to and from the same vacuum process chamber, wherein each of the first common transfer device and the second common transfer device includes a transfer mechanism configured to transfer the plurality of workpieces along the predetermined direction, and wherein the transfer mechanism includes:

a holding member configured to hold the plurality of workpieces; and a first slider configured to move along the predetermined direction and pivotally support the holding member; and a second slider configured to move along the predetermined direction and being connected to the holding member to rotate the holding member, wherein the first slider and the second slider are moved at the same speed so that the holding member moves along the predetermined direction, and the first slider and the second slider are moved at different speeds so that the holding member rotates, wherein the transfer mechanism includes a first movement mechanism configured to move the first slider and a second movement mechanism configured to move the second slider, wherein each of the first movement mechanism and the second movement mechanism includes:

a pair of pulleys arranged along the predetermined direction, at least one of which being rotatably driven by a driving source; and a belt extending over the pair of pulleys and configured to move with the rotation of the pair of pulleys, wherein one of the first slider and the second slider is fixed to the belt, wherein the first movement mechanism and the second movement mechanism include a guide extending along the predetermined direction, and each of the first slider and the second slider are configured to move along the guide, and wherein the guide is common to the first movement mechanism and the second movement mechanism.

2. The system of claim 1, wherein the load lock chamber includes a first loading/unloading port through which the plurality of workpieces is loaded into and unloaded from the first common transfer device and a second loading/unloading port through which the plurality of workpieces is loaded into and unloaded from the second common transfer device, the first loading/unloading port and the second loading/unloading port are separately formed in the load lock chamber.

3. The system of claim 1, wherein the transfer mechanism includes a cover configured to cover the first movement mechanism and the second movement mechanism.

4. The system of claim 1, wherein the holding member includes a plurality of holding members,
wherein the plurality of holding members is pivotally supported by a first single slider and is connected to a second single slider.

5. The system of claim 1, wherein the holding member includes a plurality of holding members,
wherein the plurality of holding members is pivotally supported by a single slider and is respectively connected to independent sliders.

6. The system of claim 1, wherein the holding member includes a plurality of holding members,
wherein the plurality of holding members is pivotally supported by independent first sliders, respectively, and is respectively connected to independent second sliders.

* * * * *